United States Patent
Lin et al.

(10) Patent No.: US 9,147,550 B2
(45) Date of Patent: Sep. 29, 2015

(54) GAS MIXTURE METHOD AND APPARATUS FOR GENERATING ION BEAM

(71) Applicant: ADVANCED ION BEAM TECHNOLOGY, INC., Hsinchu (TW)

(72) Inventors: Wei-Cheng Lin, Hsinchu (TW); Zhimin Wan, Sunnyvale, CA (US); Koulin Hu, Gilroy, CA (US)

(73) Assignee: ADVANCED ION BEAM TECHNOLOGY, INC., Hsinchu (TW)

( * ) Notice: Subject to any disclaimer, the term of this patent is extended or adjusted under 35 U.S.C. 154(b) by 16 days.

(21) Appl. No.: 13/692,461

(22) Filed: Dec. 3, 2012

(65) Prior Publication Data
US 2014/0151572 A1 Jun. 5, 2014

(51) Int. Cl.
H01J 27/00 (2006.01)
H01J 27/02 (2006.01)
H01J 37/08 (2006.01)

(52) U.S. Cl.
CPC ............. *H01J 27/022* (2013.01); *H01J 37/08* (2013.01); *H01J 2237/006* (2013.01); *H01J 2237/082* (2013.01); *Y10T 137/0329* (2015.04)

(58) Field of Classification Search
None
See application file for complete search history.

(56) References Cited

U.S. PATENT DOCUMENTS

| 4,135,094 | A * | 1/1979 | Hull ............................... 250/427 |
| 4,243,476 | A * | 1/1981 | Ahn et al. ........................ 216/66 |
| 7,586,109 | B2 * | 9/2009 | Perel et al. ............... 250/492.21 |
| 8,080,071 | B1 * | 12/2011 | Vail ................................. 51/293 |
| 2006/0027249 | A1 * | 2/2006 | Johnson et al. ................. 134/1.1 |
| 2007/0045570 | A1 * | 3/2007 | Chaney et al. ............ 250/492.21 |
| 2008/0179545 | A1 * | 7/2008 | Perel et al. ............... 250/492.21 |
| 2008/0237496 | A1 * | 10/2008 | Gupta ....................... 250/492.21 |
| 2009/0140165 | A1 * | 6/2009 | Hautala et al. ................. 250/427 |
| 2010/0140223 | A1 * | 6/2010 | Tyler et al. ........................ 216/67 |
| 2010/0154835 | A1 * | 6/2010 | Dimeo et al. .................... 134/31 |
| 2010/0176306 | A1 * | 7/2010 | Lin et al. ........................ 250/424 |
| 2010/0270517 | A1 * | 10/2010 | Hong et al. ............... 252/519.33 |
| 2011/0091000 | A1 * | 4/2011 | Stubbers et al. ............... 376/109 |
| 2012/0235058 | A1 * | 9/2012 | Sinha et al. .................... 250/424 |
| 2013/0140473 | A1 * | 6/2013 | Colvin et al. ............... 250/492.3 |

FOREIGN PATENT DOCUMENTS

CN 101777490 B 12/2011
TW 201232624 A 8/2012

* cited by examiner

*Primary Examiner* — Andrew Smyth
(74) *Attorney, Agent, or Firm* — Muncy, Geissler, Olds & Lowe P.C.

(57) ABSTRACT

A gas mixture method and apparatus of prolonging lifetime of an ion source for generating an ion beam particularly an ion beam containing carbon is proposed here. By mixing the dopant gas and the minor gas together to generate an ion beam, undesired reaction between the gas species and the ion source can be mitigated and thus lifetime of the ion source can be prolonged. Accordingly, quality of ion beam can be maintained.

26 Claims, 5 Drawing Sheets

GAS MIXTURE METHOD AND APPARATUS FOR GENERATING ION BEAM

BACKGROUND OF THE INVENTION

1. Field of the Invention

The present invention relates to a gas mixture method and apparatus for generating ion beam, and more particularly to a method and apparatus of prolonging lifetime of an ion source for generating an ion beam.

2. Description of the Prior Art

Electronic products bring convenience to humans' life and all these products rely on controller chips for operation. Semiconductors have desired electrical properties and thus are widely used for manufacturing chips. Generally, semiconductor wafers need to be doped with chemical elements to reach different electrical properties for different uses. For example, n-type semiconductors can be doped with electron donors (e.g. Group V elements) to increase concentration of free electrons and it affords rise in conductivity.

Currently, ion implanting process is mainly adopted by industry for doping because it can deposit ions onto wafer surface homogeneously. An ion implanter system comprises gas source, a reaction chamber, magnets, and extraction electrodes. While the dopant gas is injected into the chamber, electrons emitted from the hot cathode collide with gas molecules to generate ions. Then magnets establish a magnet field to confine those electrons to prevent them from striking the reaction chamber before colliding with gas molecules, thus to increase electron density and the plasma density. Extraction electrode placed adjacent to the aperture of the reaction chamber extracts the ions out of the plasma to form an ion beam outside the chamber along a desired trajectory. Species of dopant gas contribute to electrical presence of doped wafers such as n-type semiconductors or p-type semiconductors and may comprise $AsH_3$, $GeF_4$, $BF_3$, $CO_2$, $PH_3$ etc. The reaction chamber which accommodates the anode, cathode, reactant gases is called ion source. Stable and uniform ion beam generated from the ion source is required. However, quality of the ion beam may degrade after operating in a period of time; the interval between operation failures is called mean time between failures (MTBF) or lifetime and is considered a critical factor regarding doping process.

Operation failure may result from several reasons. First, there are probably impure particles accumulated on the cathode so to effect thermal emission of electron flow density, which can render reduced density or stability of ion beam. The situation especially occurs when fluorine is contained in dopant gas (e.g. $GeF_4$, $BF_3$). As we know, fluorine ion has strong oxidation ability and can oxidize metal atoms or other molecules. After undergoing doping process, excessive fluorine continue to exist in the reaction chamber and may erodes chamber wall. Materials of the chamber such as metal ions are then released and sputtered on the cathode under reacting atmosphere. Thus, thermal emission of electrons from the cathode is impeded, which results in unstable ion beam.

Besides, since plasma (ionized gas) is formed in the chamber, positive ions also can possibly accelerate to bombard the cathode to dissociate metal materials of the cathode, such as W or Mo, etch away the cathode material to shorten cathode lifetime; and dissociated materials may be attached to the chamber wall. However, if we add some fluorine containing gas, such as $CF_4$, the halogen effect caused by fluorine molecules can move W or Mo materials from the cooler chamber wall back to the cathode surface to prolong cathode's lifetime. The competing processes of oxidation on W or Mo cathode surfaces versus W or Mo re-deposition on W or Mo cathode surface make the ratio between dopant gas and fluorine containing minor gas critical for the best ion source performance.

Other factors degenerating quality of ion beam relate to the aforementioned phenomenon. While the cathode or chamber wall are etched or attached with impure particles thereon, which means inner surface of the chamber becomes rough, electric field may be disturbed. For example, a tiny protrusion may discharge or arc under the electric field. Consequently, plasma distribution may shift or be distorted to cause undesired results for generating the ion beam.

The above-mentioned problems cause damages to the ion source, which not only affect quality of the ion beam, but also decrease lifetime of the ion source. To solve these problems, regular maintenance such as cleaning or polishing is necessary to prolong lifetime of the ion source. Unfortunately, these actions are time-wasted and complicated steps because it requires entire dissemblance of the ion source head; maintenance cannot be performed frequently in practice otherwise the productivity of an ion implanter would be greatly impacted. Therefore, to enhance ion implanter productivity and reduce maintenance cost through prolonging lifetime of ion source, an alternative step of simple maintenance allows in-situ cleaning during generating ion beam needs to be developed.

SUMMARY OF THE INVENTION

The present invention is directed to a gas mixture method and apparatus of prolonging lifetime of an ion source for generating an ion beam. By mixing the dopant gas and the minor gas together to generate an ion beam, lifetime of the ion source can be prolonged.

In one embodiment, a gas mixture method of prolonging lifetime of an ion source for generating an ion beam comprising: supplying a dopant gas into an ion source chamber, wherein the dopant gas is a carbon-containing gas used for generating carbon-containing ions; and supplying a minor gas into the ion source chamber to dilute the dopant gas for prolonging lifetime of the ion source, wherein the minor gas can be $H_2$, $CF_4$, Xe, Kr, Ar, $PH_3$, $AsH_3$, $CH_4$ or any combination thereof; and providing a gas mixture in the ion source chamber by mixing the dopant gas and the minor gas at a mixture ratio to generate the ion beam, wherein the mixture ratio is volume ratio.

In another embodiment, a gas mixture apparatus of prolonging lifetime of an ion source for generating an ion beam comprises an ion source chamber, a dopant gas, and a minor gas. The ion source chamber has an anode and a cathode. The dopant gas is a carbon-containing gas used for generating carbon-containing ions in the ion source chamber. The minor gas is to dilute the dopant gas in the ion source chamber at a mixture ratio for prolonging lifetime of the ion source, wherein the minor gas can be $H_2$, $CF_4$, Xe, Kr, Ar, $PH_3$, $AsH_3$, $CH_4$ or any combination thereof and the mixture ratio is volume ratio.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1:
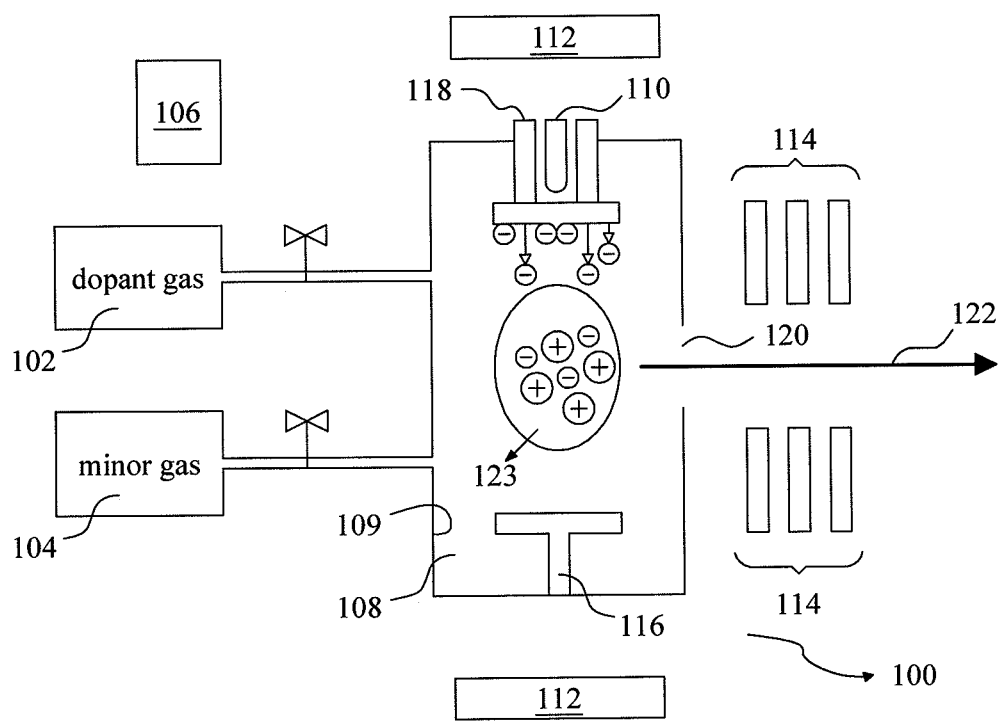
FIG. 1 is a schematic diagram of an ion source of an ion implanter according to an embodiment of the present invention.
Figure 2:
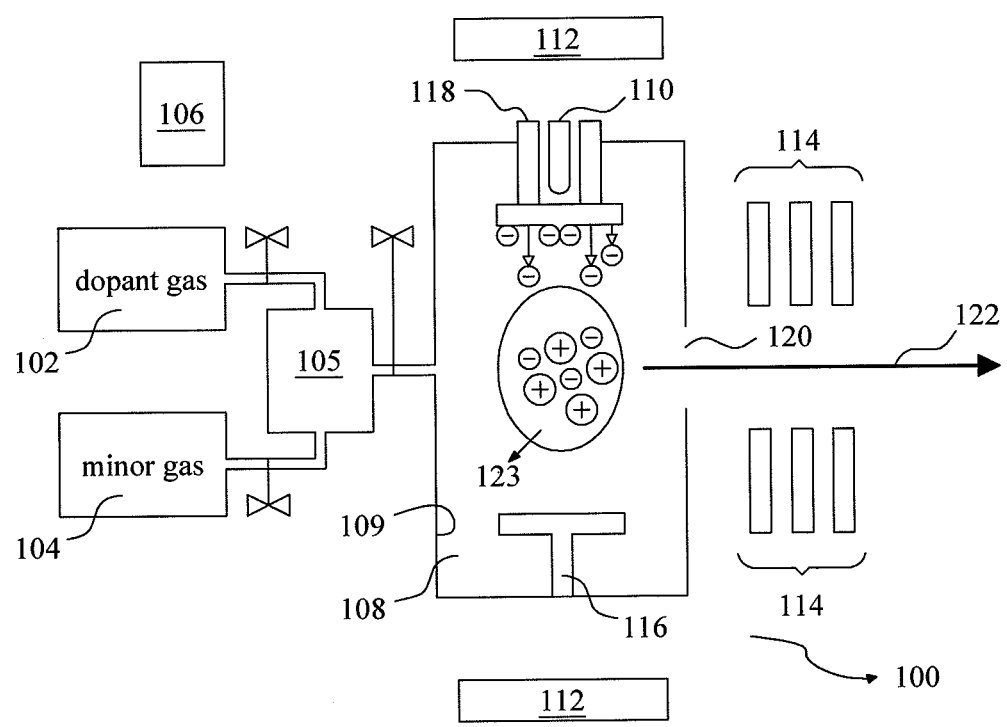
FIG. 2 is a schematic diagram of an ion source of an ion implanter according to another embodiment of the present invention.
Figure 3:
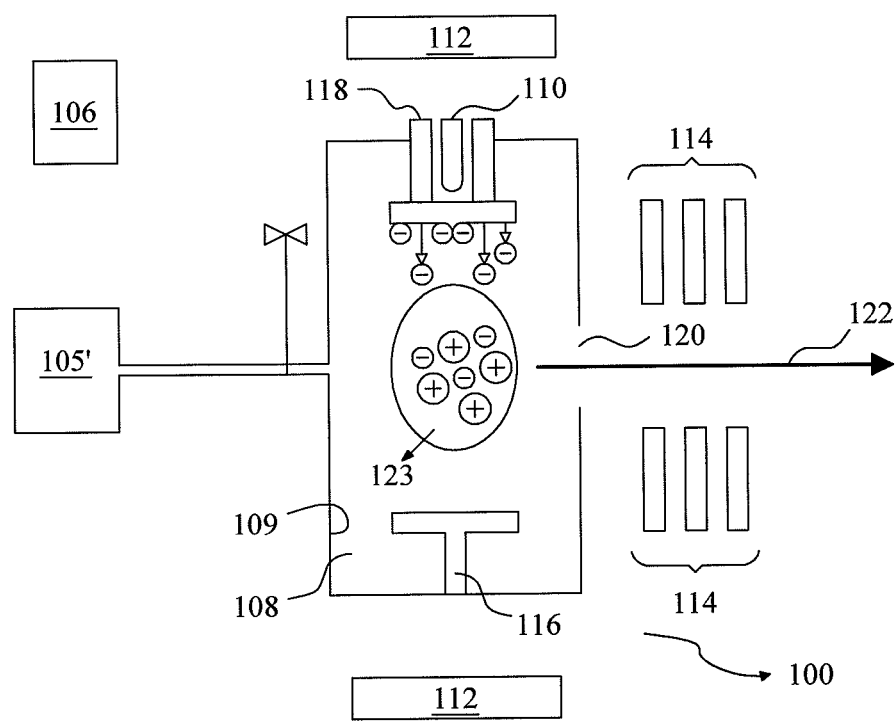
FIG. 3 is a schematic diagram of an ion source of an ion implanter according to another embodiment of the present invention.
Figure 4:
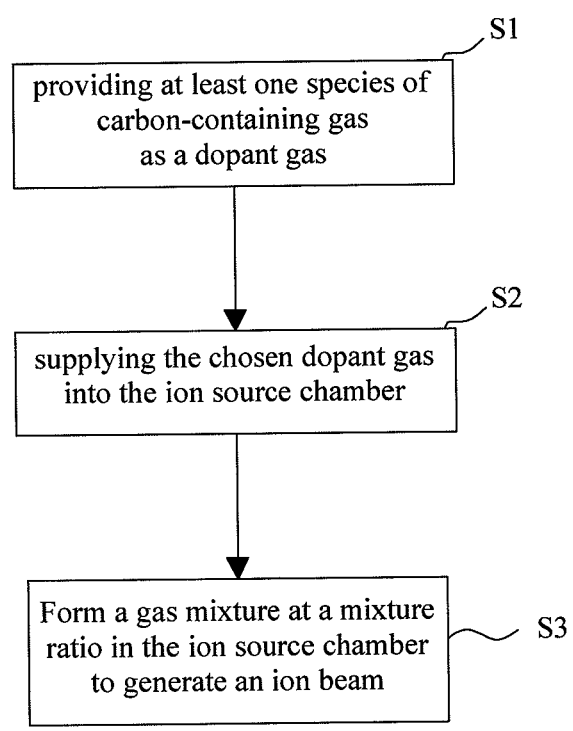
FIG. 4 and FIG. 5 are block diagrams schematically illustrated for showing the process of the gas mixture method for generating an ion beam.
Figure 5:
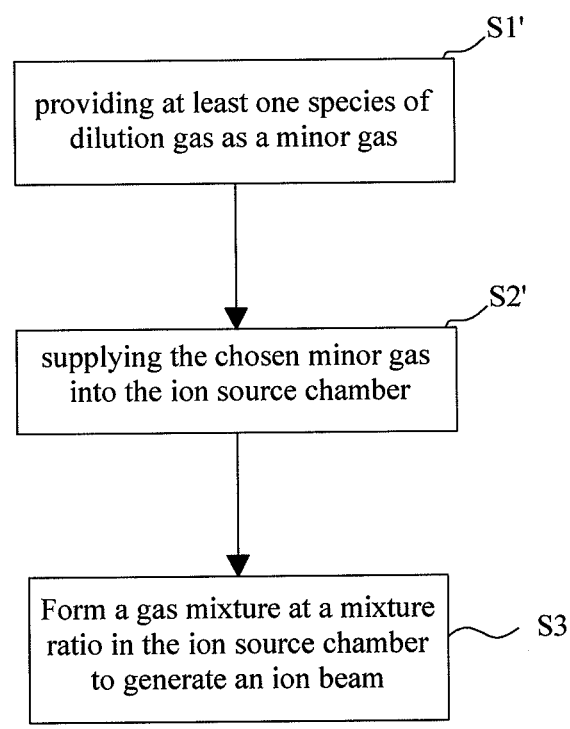

A gas mixture method of prolonging lifetime of an ion source for generating an ion beam is provided here. Referring to FIG. 1, FIG. 1 is a schematic diagram of an ion source of an ion implanter according to an embodiment of the present invention. The ion source 100 comprises a dopant gas source 102, a minor gas source 104, a controller 106, an ion source chamber 108, a heater 110, a magnet 112 and an extraction electrode 114, wherein the ion source chamber 108 has an anode 116 and a cathode 118 in opposite position and has a aperture 120 at one side. Also refer to FIG. 1, FIG. 4 and FIG. 5, FIG. 4 and FIG. 5 are block diagrams schematically illustrated for showing the process of the gas mixture method for generating an ion beam. The first step of the gas mixture method is to provide at least one species of carbon-containing gas as a dopant gas (S1). Choosing the species of the dopant gas depends on the kinds of ions interested. For example, when generating carbon-containing ion beams, such as C+, C2+, C++, and CO+, carbon-containing gases such as CO, $CO_2$, $CH_4$, $CF_4$, and $C_2H_2O_4$ or any combination thereof can be chosen as the dopant gas. At the same time, at least one species of dilution gas is chosen as a minor gas (S1'). The minor gas can be inert gas, such as Xe, Kr and Ar, or other species such as $PH_3$, $AsH_3$, $CF_4$ and $CH_4$ or any combination thereof. Once the chosen dopant gas and the chosen minor gas are determined, they are directly injected into the ion source chamber 108 (S2 and S2') and mixed at a fixed mixture ratio to generate an ion beam 122 (S3), wherein the mixture ratio is volume ratio. It could be understood that the dopant gas and the minor gas also can be pre-mixed in a reservoir 105 (as shown in FIG. 2) to reach a fixed mixture ratio and then injected into the ion source chamber 108. The dopant gas source 102, the minor gas source 104 and the reservoir 105 also can be replaced with a gas bottle 105' and the dopant gas and minor gas are already pre-mixed at a fixed mixture ratio therein, for example, referring to FIG. 3, the dopant gas and the minor gas are already mixed at a fixed mixture ratio of A:X:Y:Z in the gas bottle 105'. In one embodiment, A, X, Y and Z can be $CO_2$, $CF_4$, $H_2$ and Kr, and the mixed ratio can be 10:0.5:3:1. The number of gas species in the reservoir 105 or gas bottle 105' is not limited, for example, there are possibly three or more species of gases mixed in the reservoir 105 or gas bottle 105'. Controller 106 provided here can be a single function or multifunction controller to control gas flow, power supply, heating etc. In this embodiment, the controller 106 can control gas flow of the dopant gas and the minor gas.

After providing a gas mixture in the ion source chamber 108, the cathode 118 is heated by a heater 110, which is known as indirectly heated cathode ion source. Heating can be controlled by the controller 106. When the cathode 118 reaches to a high-enough temperature that electrons can overcome the work function, electrons will emit from the hot cathode 118 toward the anode 116. In an embodiment, the heater 110 can be a filament or a heating coil. In some embodiments, the cathode 118 and the anode 116 are made of W or Mo. In other embodiments, the cathode 118 can be a heating filament itself that is hot enough to emit electrons, which is known as traditional Bernas ion source. Through the thermal emission, electrons will collide with the gas molecules. Outer electrons of the gas molecules receive huge amount of energy passed by the emitting electrons and then escape, which makes gases ionized (i.e. plasma 123) and ions are generated.

A magnetic field is applied to interact with electrical field by placing magnets 112 outside the ion source chamber 108 to maintain the plasma 123 in a proper shape and location. Finally, the ions in the plasma 123 are extracted outside the ion source chamber 108 through the aperture 120 to become an ion beam 100 by the extraction electrode 114.

The minor gases provided here at least comprises several advantages. The minor gas can dilute the dopant gas and makes it less reactive with the chamber wall 109 and the cathode 118. In other words, the minor gas can become a buffer medium between the chamber wall 109 and surface of cathode 118 and reactive species (e.g. $F^-$). Therefore, etching effects or accumulation of impurity to the chamber wall 109 and the cathode 118 can be mitigated and thermal emission of electrons will not decline. On the other hand, since the chamber wall 109 and the cathode 118 are not etched or attached with impure particles, electrical field formed inside the ion source chamber 108 will not be affected so as to maintain the shape and the location of plasma 123; emission trajectory or current density of the ion beam 122 can present in a proper manner.

A gas mixture apparatus of prolonging lifetime of an ion source for generating an ion beam is also provided here. In one embodiment, referring to FIG. 1, a gas mixture apparatus of prolonging lifetime of an ion source for generating an ion beam comprises an ion source chamber 108, a dopant gas source 102 for providing a dopant gas, and a minor gas source 104 for providing a minor gas. The ion source chamber 108 has an anode 116 and a cathode 118. The dopant gas is a carbon-containing gas used for generating carbon-containing ions in the ion source chamber 108. The minor gas is to dilute the dopant gas in the ion source chamber 108 at a mixture ratio for prolonging lifetime of the ion source, wherein the minor gas can be $H_2$, $CF_4$, Xe, Kr, Ar, $PH_3$, $AsH_3$, $CH_4$ or any combination thereof and the mixture ratio is volume ratio. In an embodiment, the dopant gas can be CO, $CO_2$, $CH_4$, $CF_4$, $C_2H_2O_4$ or any combination thereof. Other operation principles and steps are described before and will not be elaborated here.

In one embodiment, the dopant gas and the minor gas can be directly mixed in the ion source chamber 108. Otherwise, in another embodiment, the gas mixture apparatus further comprises a reservoir 105 (FIG. 2) and the dopant gas and the minor gas can be pre-mixed in the reservoir 105 at the mixture ratio before entering the ion source chamber 108. The dopant gas source 102, the minor gas source 104 and the reservoir 105 also can be replaced with a gas bottle 105' and the dopant gas and minor gas are already pre-mixed at a fixed mixture ratio therein, for example, referring to FIG. 3, the dopant gas and the minor gas are already mixed with a fixed mixture ratio of A:X:Y:Z in the gas bottle 105'. In one embodiment, A, X, Y and Z can be $CO_2$, $CF_4$, $H_2$ and Kr, and the mixed ratio can be 10:0.5:3:1. The number of gas species in the reservoir 105 or gas bottle 105' is not limited, for example, there are possibly three or more species of gases mixed in the reservoir 105 or gas bottle 105'.

In an embodiment, the gas mixture of the dopant gas and the minor gas comprises $C_{O2}$, CO and $H_2$. The mixture ratio of $CO_2$, CO and $H_2$ is 10:A:X, wherein A ranges from 0.1 to 2 and X ranges from 1 to 6. Preferably, the mixture ratio of $CO_2$, CO and $H_2$ is 10:0.5:3.

In an embodiment, the gas mixture of the dopant gas and the minor gas comprises $CO_2$, CO, $H_2$ and Xe. The mixture ratio of $CO_2$, CO, $H_2$ and Xe is 10:A:X:Y, wherein A ranges from 0.1 to 2, X ranges from 1 to 6 and Y ranges from 0.3 to 1.2. Preferably, the mixture ratio of $CO_2$, CO, $H_2$ and Xe is 10:0.5:3:0.6.

In an embodiment, the gas mixture of the dopant gas and the minor gas comprises $CO_2$, CO, $H_2$ and Kr.11. The mixture ratio of $CO_2$, CO, $H_2$ and Kr is 10:A:X:Y, wherein A ranges from 0.1 to 2, X ranges from 1 to 6 and Y ranges from 0.5 to 2. Preferably, the mixture ratio of $CO_2$, CO, $H_2$ and Kr is 10:0.5:3:1.

In an embodiment, the gas mixture of the dopant gas and the minor gas comprises $CO_2$, CO, $H_2$ and Ar. The mixture ratio of $CO_2$, CO, $H_2$ and Ar is 10:A:X:Y, wherein A ranges from 0.1 to 2, X ranges from 1 to 6 and Y ranges from 1 to 4. Preferably, the mixture ratio of $CO_2$, CO, $H_2$ and Ar is 10:0.5:3:2.

In an embodiment, the gas mixture of the dopant gas and the minor gas comprises $CO_2$, $CF_4$ and $H_2$. The mixture ratio of $CO_2$, $CF_4$ and $H_2$ is 10:A:X, wherein A ranges from 0.1 to 2 and X ranges from 1 to 6. Preferably, the mixture ratio of $CO_2$, $CF_4$ and $H_2$ is 10:0.5:3.

In an embodiment, the gas mixture of the dopant gas and the minor gas comprises $CO_2$, $CF_4$, $H_2$ and Xe. The mixture ratio of $CO_2$, $CF_4$, $H_2$ and Xe is 10:A:X:Y, wherein A ranges from 0.1 to 2, X ranges from 1 to 6 and Y ranges from 0.3 to 1.2. Preferably, the mixture ratio of $CO_2$, $CF_4$, $H_2$ and Xe is 10:0.5:3:0.3.

In an embodiment, the gas mixture of the dopant gas and the minor gas comprises $CO_2$, $CF_4$, $H_2$ and Kr. The mixture ratio of $CO_2$, $CF_4$, $H_2$ and Kr is 10:A:X:Y, wherein A ranges from 0.1 to 2, X ranges from 1 to 6 and Y ranges from 0.5 to 2. Preferably, the mixture ratio of $CO_2$, $CF_4$, $H_2$ and Kr is 10:0.5:3:1.

In an embodiment, the gas mixture of the dopant gas and the minor gas comprises $CO_2$, $CF_4$, $H_2$ and Ar. The mixture ratio of $CO_2$, $CF_4$, $H_2$ and Ar is 10:A:X:Y, wherein A ranges from 0.1 to 2, X ranges from 1 to 6 and Y ranges from 1 to 4. Preferably, the mixture ratio of $CO_2$, $CF_4$, $H_2$ and Ar is 10:0.5:3:2.

In an embodiment, the gas mixture of the dopant gas and the minor gas comprises $CO_2$, CO, $H_2$, and $CF_4$. The mixture ratio of $CO_2$, CO, $H_2$ and $CF_4$ is 10:A:X:Y, wherein A ranges from 0.5 to 5, X ranges from 1 to 6 and Y ranges from 0.05 to 1. Preferably, the mixture ratio of $CO_2$, CO, $H_2$ and $CF_4$ and is 10:1:3:0.1.

In an embodiment, the gas mixture of the dopant gas and the minor gas comprises $CO_2$, CO, $H_2CF_4$ and Xe. The mixture ratio of $CO_2$, CO, $H_2$, $CF_4$ and Xe is 10:A:X:Y:Z, wherein A ranges from 0.5 to 5, X ranges from 1 to 6 and Y ranges from 0.05 to 1 and Z ranges from 0.3 to 1.2. Preferably, the mixture ratio of $CO_2$, CO, $H_2$, $CF_4$ and Xe is 10:1:3:0.1:0.6.

In an embodiment, the gas mixture method according to claim 31, wherein the gas mixture comprises $CO_2$, CO, $H_2CF_4$ and Kr. The mixture ratio of $CO_2$, CO, $H_2$, $CF_4$ and Kr is 10:A:X:Y:Z, wherein A ranges from 0.5 to 5, X ranges from 1 to 6 and Y ranges from 0.05 to 1 and Z ranges from 0.5 to 2. Preferably, the mixture ratio of $CO_2$, CO, $H_2$, $CF_4$ and Kr is 10:1:3:0.1:1.

In an embodiment, the gas mixture of the dopant gas and the minor gas comprises $CO_2$, CO, $H_2CF_4$ and Ar. The mixture ratio of $CO_2$, CO, $H_2$, $CF_4$ and Ar is 10:A:X:Y:Z, wherein A ranges from 0.5 to 5, X ranges from 1 to 6 and Y ranges from 0.05 to 1 and Z ranges from 1 to 4. Preferably, the mixture ratio of $CO_2$, CO, $H_2$, $CF_4$ and Ar is 10:1:3:0.1:2.

To summarize the foregoing descriptions, the present invention proposes a gas mixture method of prolonging lifetime of an ion source for generating an ion beam particularly an ion beam containing carbon element. By mixing the dopant gas and the minor gas together to generate an ion beam, undesired reaction between the gas species and the ion source can be mitigated and thus lifetime of the ion source can be prolonged. Accordingly, quality of ion beam can be maintained.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A gas mixture method of prolonging lifetime of an ion source for generating an ion beam comprising:
   supplying a dopant gas into a reservoir, wherein the dopant gas is a carbon-containing gas used for generating carbon-containing ions; and
   supplying a minor gas into the reservoir to dilute the dopant gas for prolonging lifetime of the ion source, wherein the minor gas can be $H_2$, $CF_4$, Xe, Kr, Ar, $PH_3$, $AsH_3$, $CH_4$ or any combination thereof; and
   providing a gas mixture comprising $CO_2$, $H_2$ and $CF_4$ in the ion source chamber to generate the ion beam after pre-mixing the dopant gas and the minor gas at a mixture ratio in the reservoir, wherein the mixture ratio of $CO_2$, $CF_4$ and $H_2$ is 10:A:X, wherein A ranges from 0.1 to 2 and X ranges from 1 to 6 and the mixture ratio is volume ratio.

2. The gas mixture method according to claim 1, wherein the dopant gas can be CO, $CO_2$, $CH_4$, $CF_4$, $C_2H_2O_4$ or any combination thereof.

3. The gas mixture method according to claim 1, wherein the mixture ratio of $CO_2$, $CF_4$ and $H_2$ is 10:0.5:3.

4. The gas mixture method according to claim 1, wherein the gas mixture comprises $CO_2$, $CF_4$, and Xe.

5. The gas mixture method according to claim 4, wherein the mixture ratio of $CO_2$, $CF_4$, $H_2$ and Xe is 10:A:X:Y, wherein A ranges from 0.1 to 2, X ranges from 1 to 6 and Y ranges from 0.3 to 1.2.

6. The gas mixture method according to claim 4, wherein mixture ratio of $CO_2$, $CF_4$, $H_2$ and Xe is 10:0.5:3:0.3.

7. The gas mixture method according to claim 1, wherein the gas mixture comprises $CO_2$, $CF_4$, $H_2$ and Kr.

8. The gas mixture method according to claim 7, wherein the mixture ratio of $CO_2$, $CF_4$, $H_2$ and Kr is 10:A:X:Y, wherein A ranges from 0.1 to 2, X ranges from 1 to 6 and Y ranges from 0.5 to 2.

9. The gas mixture method according to claim 7, wherein the mixture ratio of $CO_2$, $CF_4$, $H_2$ and Kr is 10:0.5:3:1.

10. The gas mixture method according to claim 1, wherein the gas mixture comprises $CO_2$, $CF_4$, $H_2$ and Ar.

11. The gas mixture method according to claim 10, wherein the mixture ratio of $CO_2$, $CF_4$, $H_2$ and Ar is 10:A:X:Y, wherein A ranges from 0.1 to 2, X ranges from 1 to 6 and Y ranges from 1 to 4.

12. The gas mixture method according to claim 10, wherein the mixture ratio of $CO_2$, $CF_4$, $H_2$ and Ar is 10:0.5:3:2.

13. The gas mixture method according to claim 1, wherein the gas mixture comprises $CO_2$, CO, $H_2$, and $CF_4$.

14. The gas mixture method according to claim 13, wherein the mixture ratio of $CO_2$, CO, $H_2$ and $CF_4$ is 10:A:X:Y, wherein A ranges from 0.5 to 5, X ranges from 1 to 6 and Y ranges from 0.05 to 1.

15. The gas mixture method according to claim 13, wherein the mixture ratio of $CO_2$, CO, $H_2$ and $CF_4$ and is 10:1:3:0.1.

16. The gas mixture method according to claim 1, wherein the gas mixture comprises $CO_2$, CO, $H_2$, $CF_4$ and Xe.

17. The gas mixture method according to claim 16, wherein the mixture ratio of $CO_2$, CO, $H_2$, $CF_4$ and Xe is 10:A:X:Y:Z, wherein A ranges from 0.5 to 5, X ranges from 1 to 6 and Y ranges from 0.05 to 1 and Z ranges from 0.3 to 1.2.

18. The gas mixture method according to claim 16, wherein the mixture ratio of $CO_2$, CO, $H_2$, $CF_4$ and Xe is 10:1:3:0.1:0.6.

19. The gas mixture method according to claim 1, wherein the gas mixture comprises $CO_2$, CO, $H_2$, $CF_4$ and Kr.

20. The gas mixture method according to claim 19, wherein the mixture ratio of $CO_2$, CO, $H_2$, $CF_4$ and Kr is 10:A:X:Y:Z, wherein A ranges from 0.5 to 5, X ranges from 1 to 6 and Y ranges from 0.05 to 1 and Z ranges from 0.5 to 2.

21. The gas mixture method according to claim 19, wherein the mixture ratio of $CO_2$, CO, $H_2$, $CF_4$ and Kr is 10:1:3:0.1:1.

22. The gas mixture method according to claim 1, wherein the gas mixture comprises $CO_2$, CO, $H_2$, $CF_4$ and Ar.

23. The gas mixture method according to claim 22, wherein the mixture ratio of $CO_2$, CO, $H_2$, $CF_4$ and Ar is 10:A:X:Y:Z, wherein A ranges from 0.5 to 5, X ranges from 1 to 6 and Y ranges from 0.05 to 1 and Z ranges from 1 to 4.

24. The gas mixture method according to claim 22, wherein the mixture ratio of $CO_2$, CO, $H_2$, $CF_4$ and Ar is 10:1:3:0.1:2.

25. A gas mixture apparatus of prolonging lifetime of an ion source for generating an ion beam comprising:
an ion source chamber having an anode and a cathode;
a dopant gas, wherein the dopant gas is a carbon-containing gas used for generating carbon-containing ions in the ion source chamber;
a reservoir; and
a minor gas to dilute the dopant gas in the reservoir, wherein a gas mixture comprising CO2, H2 and CF4 is provided into the ion source chamber to generate the ion beam after pre-mixing the dopant gas and the minor gas at a mixture ratio in the reservoir, the minor gas can be H2, CF4, Xe, Kr, Ar, PH3, ASH3, CH4 or any combination thereof, wherein the mixture ratio of CO2, CF4 and H2 is 10:A:X, wherein A ranges from 0.1 to 2 and X ranges from 1 to 6 and the mixture ratio is volume ratio.

26. The gas mixture apparatus according to claim 25, wherein the dopant gas can be CO, $CO_2$, $CH_4$, $CF_4$, $C_2H_2O_4$ or any combination thereof.

* * * * *